United States Patent
Terletzki (10) Patent No.: US 8,896,087 B2
(45) Date of Patent: Nov. 25, 2014

(54) SHALLOW TRENCH ISOLATION AREA HAVING BURIED CAPACITOR

(75) Inventor: Hartmud Terletzki, Graz (AT)

(73) Assignee: Infineon Technologies AG, Neubiberg (DE)

( * ) Notice: Subject to any disclaimer, the term of this patent is extended or adjusted under 35 U.S.C. 154(b) by 574 days.

(21) Appl. No.: 12/792,507

(22) Filed: Jun. 2, 2010

(65) Prior Publication Data

US 2011/0298085 A1 Dec. 8, 2011

(51) Int. Cl.
| | |
|---|---|
| H01L 29/00 | (2006.01) |
| H01L 27/02 | (2006.01) |
| H01L 49/02 | (2006.01) |
| H01L 27/06 | (2006.01) |
| H01L 29/94 | (2006.01) |
| H01L 29/66 | (2006.01) |

(52) U.S. Cl.
CPC ........... *H01L 27/0629* (2013.01); *H01L 29/945* (2013.01); *H01L 27/0207* (2013.01); *H01L 28/65* (2013.01); *H01L 29/66181* (2013.01)
USPC .................................. 257/516; 257/E29.342

(58) Field of Classification Search
USPC .......................................... 257/516, E29.342
See application file for complete search history.

(56) References Cited

U.S. PATENT DOCUMENTS

| | | | |
|---|---|---|---|
| 5,665,616 A | * | 9/1997 | Kimura et al. ................ 438/234 |
| 5,952,695 A | * | 9/1999 | Ellis-Monaghan et al. .. 257/347 |
| 6,420,770 B1 | | 7/2002 | Xiang et al. |
| 6,509,232 B1 | | 1/2003 | Kim et al. |
| 6,949,785 B2 | | 9/2005 | Tu |
| 7,262,090 B2 | | 8/2007 | Tu |
| 7,265,408 B2 | | 9/2007 | Nakagawa |
| 7,635,899 B2 | | 12/2009 | Yang et al. |
| 2004/0232461 A1 | * | 11/2004 | Huang .......................... 257/296 |
| 2005/0139887 A1 | * | 6/2005 | Song ............................. 257/296 |
| 2007/0045770 A1 | * | 3/2007 | Aoki ............................. 257/516 |
| 2008/0142861 A1 | * | 6/2008 | Collins et al. ................. 257/296 |

* cited by examiner

Primary Examiner — Matthew Reames
(74) Attorney, Agent, or Firm — Slater & Matsil, L.L.P.

(57) ABSTRACT

A semiconductor chip includes a substrate including a surface, an active transistor region and a substrate contact region formed on the substrate, a shallow trench isolation (STI) area formed in the surface and disposed at least partially between the active transistor region and the substrate contact region, and at least one capacitor at least partially buried in the STI area.

29 Claims, 10 Drawing Sheets

SHALLOW TRENCH ISOLATION AREA HAVING BURIED CAPACITOR

CROSS-REFERENCE TO RELATED APPLICATIONS

1. Field of the Invention

The present invention relates to semiconductors, and more particularly, relates to an apparatus and method to bury buffer capacitors in shallow trench isolation (STI) areas of semiconductor chips.

2. Background of the Invention

Integrated circuits (ICs) are miniaturized electronic circuits that typically include semiconductor devices as well as other components, and have widespread applications throughout the world of electronics. The semiconductor devices used within ICs include a number of electrical components disposed next to each other. Semiconductor devices are typically fabricated by sequentially depositing insulating or dielectric layers, conductive layers, and semiconductive layers of material over a semiconductor substrate, and patterning the various layers using lithography to form circuit components and elements thereon, forming integrated circuits.

To prevent electrical current leakage between regions of the semiconductor substrate, including active transistor regions, substrate contact regions, etc., semiconductor devices are designed to include shallow trench isolation (STI) areas. These STI areas prevent electrical current leakage between the regions. STI areas are typically distributed throughout the semiconductor device and separate the regions from each other.

STI areas can be formed by using a series of different techniques well known in the art, such as trench definition and etching, optionally lining the trench with a diffusion barrier, and filling the trench with a trench dielectric such as an oxide. Various oxides and nitrides are frequently used as the STI dielectric material. Conventionally, STI areas do not contain any electrical components and are used for the primary purpose of separating active transistor regions.

Figure 1:
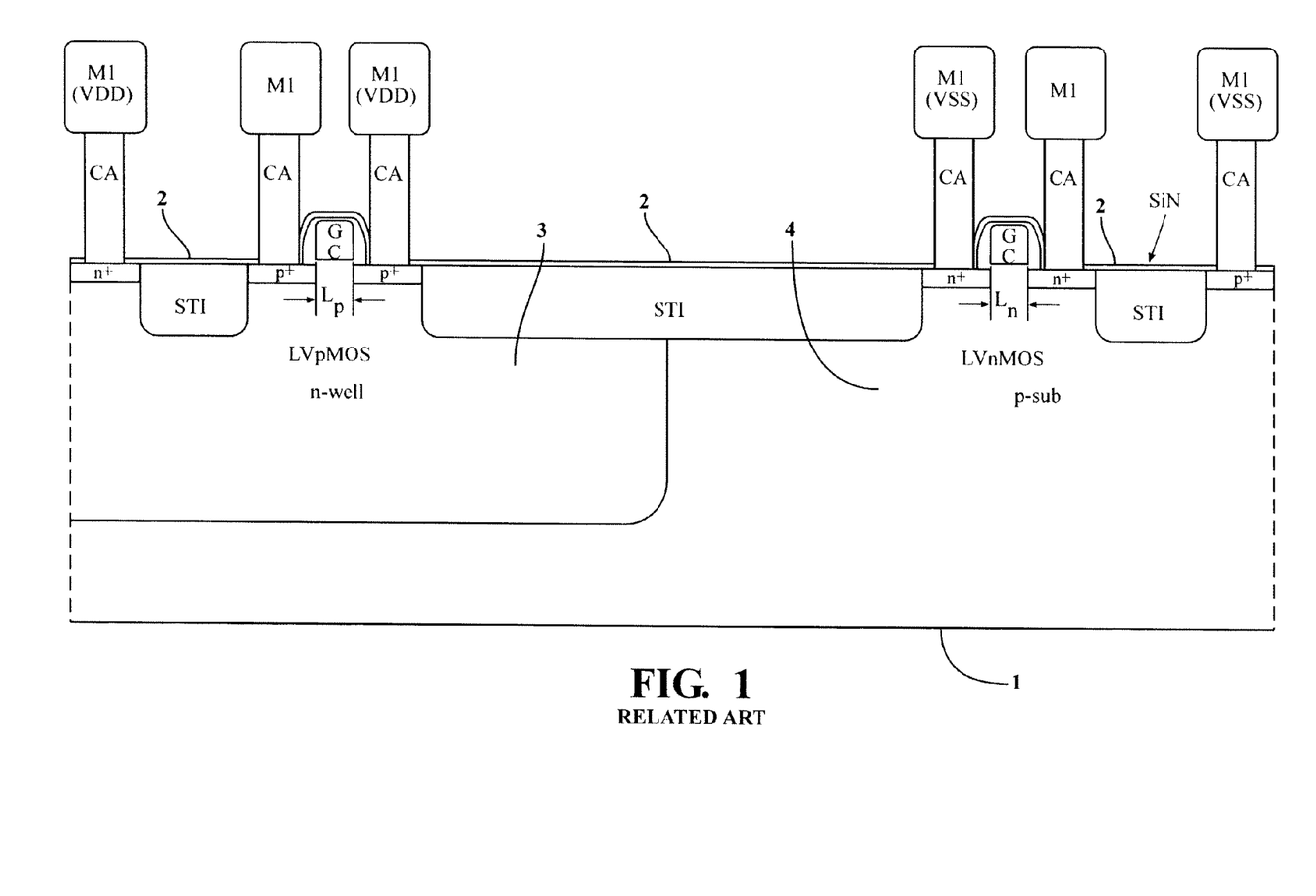
FIG. 1 depicts a cross-sectional view of a semiconductor chip having conventional shallow trench isolation (STI) areas.

FIG. 1 depicts a cross-section of a semiconductor chip 1 having conventional STI areas 2. As shown in FIG. 1, the STI area 2 isolates active transistor regions 3 and 4 from each other. For example, the STI area 2 isolates the active transistor regions 3 and 4 to prevent electrical current leakage between the two active transistor regions 3 and 4. One of the active transistor regions 3 and 4 may also be a substrate contact region. As a result, the performances of the active transistor regions 3 and 4 not affected by electrical current leakage.

Figure 2:
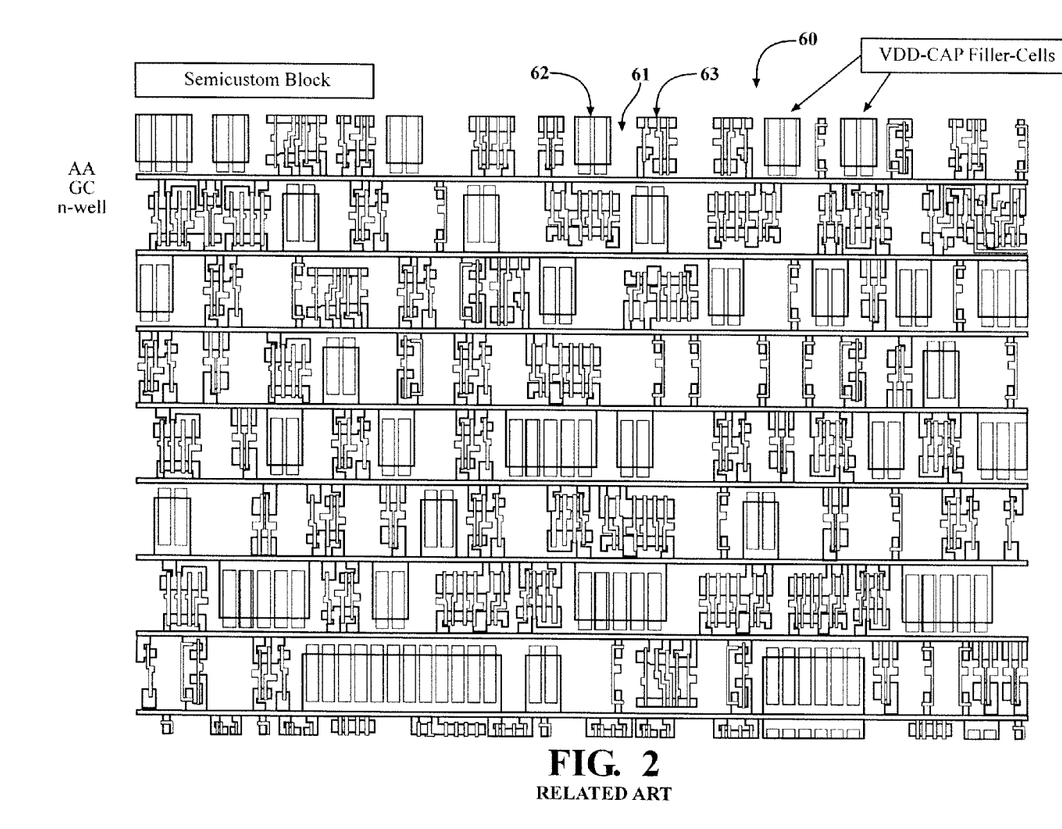
FIG. 2 depicts a top view of a semicustom block having the semiconductor chip of FIG. 1.

FIG. 2 depicts a top view of a semicustom block 60, such as the Infineon™ M1580 semicustom block, having the semiconductor chip 1 shown in FIG. 1. Semicustom blocks consist of pre-defined standard cells. The block 60 includes a number of active components, such as the semiconductor chip 1, other active transistor regions (e.g., FETs), and a number of passive components. The block 60 further includes a number of STI areas 61 disposed in between active transistor regions 62 and 63 to prevent electrical current leakage between the two active transistor regions 62 and 63. As shown in the block 60, the STI areas 61 are devoid of any electrical components.

Additionally, semiconductors often utilize buffer capacitors (also referred to as CAPs) to protect the integrity of the electrical components. These CAPs, which may include special capacitance cells, capacitance macros and metal-insulator-metal (MIM) CAPs, are utilized to suppress voltage surges that might otherwise damage other parts in the circuit. Accordingly, these CAPs stabilize the internal chip VDD voltage supply and the internal chip bias nodes. Also, area-neutral parasitic capacitors—such as a junction capacitor between the n-well and p-substrate—may be utilized as well.

However, buffer capacitors frequently use 10%-20% of the available chip space, or even more for specific chips. Furthermore, the area-neutral parasitic capacitors contribute only a relatively small amount to the overall capacitance that is required, and are also rather inefficient due to the high-resistance lines frequently employed in their design.

Accordingly, there is a need to more efficiently utilize existing semiconductor chip space to house buffer capacitors, especially given the significant emphasis on miniaturization of ICs. Furthermore, there is a need to conserve overall space throughout the semiconductor chip. There is also a need to distribute a sufficient amount of buffer capacitors throughout the semiconductor chip to achieve the overall capacitance that is required to protect the electrical components from voltage surges and other electrical disturbances. There is additionally a need to distribute the buffer capacitors evenly throughout the semiconductor chip.

SUMMARY OF THE INVENTION

Aspects of the present invention solve these problems in the related art by concealing buffer capacitors in the existing, but otherwise unused, STI (Shallow Trench Isolation) area of the semiconductor chip, which is generally distributed throughout the entire chip. As a result, the chip space is more efficiently utilized, thereby improving chip performance. Furthermore, since the STI areas are distributed throughout the semiconductor chip, the buffer capacitors can likewise be distributed throughout the chip, achieving a sufficiently high level of capacitance to protect the electrical components. Moreover, the buffer capacitance can be distributed equally across the entire chip. The result is a smaller chip area and greater effectiveness in use of the corresponding capacitance. The smaller chip area also results in lower costs per chip.

According to an embodiment of the invention, a semiconductor chip includes a substrate including a surface, an active transistor region and a substrate contact region formed on the substrate, a shallow trench isolation (STI) area formed in the surface and disposed at least partially between the first and second active transistor regions, and at least one capacitor at least partially buried in the STI area.

According to one aspect, the at least one capacitor includes a plurality of capacitors arranged such that the capacitors are completely buried within the STI area, plates of the capacitors are disposed in a direction perpendicular to the top surface of the substrate, and the capacitors are connected to each other in a line-to-line configuration.

According to another aspect, the at least one capacitor includes plates which are substantially parallel to the surface and each other and separated by an insulator, and only one of the plates is buried in the STI area.

According to still another aspect, the at least one capacitor includes plates which are substantially parallel to the surface and each other, separated by an insulator, and completely buried in the STI area.

According to yet another aspect, the semiconductor chip includes a p-substrate, and a lower plate of the capacitor plates disposed farther from the surface is disposed at least partially above the p-substrate and is connected to a ground voltage VSS (GND) or lower than a potential of the p-substrate via an electrode.

According to another aspect, the semiconductor chip includes an n-well, and a lower plate of the capacitor plates disposed farthest from the surface is disposed at least partially above the n-well and is connected to a positive potential VDD or higher than a potential of the n-well via an electrode.

According to another aspect, the semiconductor chip includes an n-well and a p-substrate, and a lower plate of the capacitor plates disposed farthest from the surface is disposed at least partially above both the n-well and p-substrate.

According to still another aspect, the at least one capacitor includes a plurality of capacitors arranged such that each of the capacitors are completely buried within the STI area, plates of each of the capacitors are separated by an insulator and disposed in a direction parallel to the surface of the substrate and each other, and the capacitors are connected to each other in a stacked configuration from a top part of the STI area to a bottom part of the STI area such that the plates of each capacitor are parallel to the surface.

According to yet another aspect, the at least one capacitor includes a plurality of capacitors arranged such that the capacitors are completely buried within the STI area, plates of each of the capacitors are separated by an insulator and disposed in a direction perpendicular to the surface of the substrate, and the capacitors are connected to each other in a vertical stacked configuration from one sidewall of the STI area to another sidewall of the STI area such that the plates of each capacitor are perpendicular to the surface.

According to another aspect, the at least one capacitor includes a pair of plates facing each other and one of the plates is at least partially buried in the STI area.

According to another aspect, a depth of the STI area is sufficient to bury the at least one capacitor.

According to another embodiment of the present invention, a shallow trench isolation (STI) area disposed between an active transistor region and a substrate contact region of a semiconductor chip includes an isolation trench formed into a surface of a substrate of the semiconductor chip, the isolation trench having sidewalls extending into the substrate, and at least one buffer capacitor which is at least partially buried in the STI area between the sidewalls.

According to an aspect, the at least one capacitor includes a plurality of capacitors arranged such that the capacitors are completely buried within the STI area, plates of the capacitors are disposed in a direction perpendicular to the surface of the substrate, and the capacitors are connected to each other in a line-to-line configuration.

According to another aspect, the at least one capacitor includes plates which are substantially parallel to the surface and each other and separated by an insulator, and only one of the plates is buried in the STI area.

According to still another aspect, the at least one capacitor includes plates which are substantially parallel to the surface and each other, separated by an insulator, and completely buried in the STI area.

According to yet another aspect, the at least one capacitor includes a plurality of capacitors arranged such that each of the capacitors are completely buried within the STI area, plates of each of the capacitors are separated by an insulator and disposed in a direction parallel to the surface of the substrate and each other, and the capacitors are connected to each other in a stacked configuration from a top part of the STI area to a bottom part of the STI area such that the plates of each capacitor are parallel to the surface.

According to another aspect, the at least one capacitor includes a plurality of capacitors arranged such that the capacitors are completely buried within the STI area, plates of each of the capacitors are separated by an insulator and disposed in a direction perpendicular to the surface of the substrate, and the capacitors are connected to each other in a vertical stacked configuration from one sidewall of the STI area to another sidewall of the STI area such that the plates of each capacitor are perpendicular to the surface.

According to still another aspect, the STI area further includes a dielectric material.

According to yet another aspect, the sidewalls are substantially perpendicular to the surface.

According to still another embodiment of the present invention, a method to bury at least one capacitor within a semiconductor chip includes forming a shallow trench isolation (STI) area in a surface of the semiconductor chip in between an active transistor region and a substrate contact region of the semiconductor chip, and at least partially burying the at least one capacitor in the STI area.

According to an aspect, the at least partially burying of the at least one capacitor includes at least one of completely burying a plurality of the at least one capacitors, each of the capacitors having two plates separated by an insulator, within the STI area, such that the plates of the capacitors are disposed in a direction perpendicular to the surface, and the capacitors are connected to each other in a line-to-line configuration, partially burying the at least one capacitor within the STI area such that the two plates are substantially parallel to the surface and only one of the plates is buried in the STI area, completely burying the at least one capacitor within the STI area such that the two plates are substantially parallel to the surface in the STI area, completely burying the plurality of the at least one capacitors within the STI area such that the capacitors are connected to each other in a stacked configuration from a top part of the STI area to a bottom part of the STI area wherein the plates of each capacitor are parallel to the surface and each other, and completely burying the plurality of the at least one capacitors within the STI area such that the capacitors are connected to each other in a vertical stacked configuration from one sidewall of the STI area to another sidewall of the STI area wherein the plates of each capacitor are perpendicular to the surface and parallel to each other.

According to yet another embodiment of the present invention, a semicustom block includes a block to house at least one semiconductor chip, and the semiconductor chip according to an embodiment of the present invention housed within the block.

BRIEF DESCRIPTION OF THE DRAWINGS

These and other objects, features and advantages of aspects of the present invention will become apparent from the following detailed description of illustrative embodiments thereof, which is to be read in connection with the accompanying drawings, in which.

DETAILED DESCRIPTION OF THE EMBODIMENTS

Figure 3:
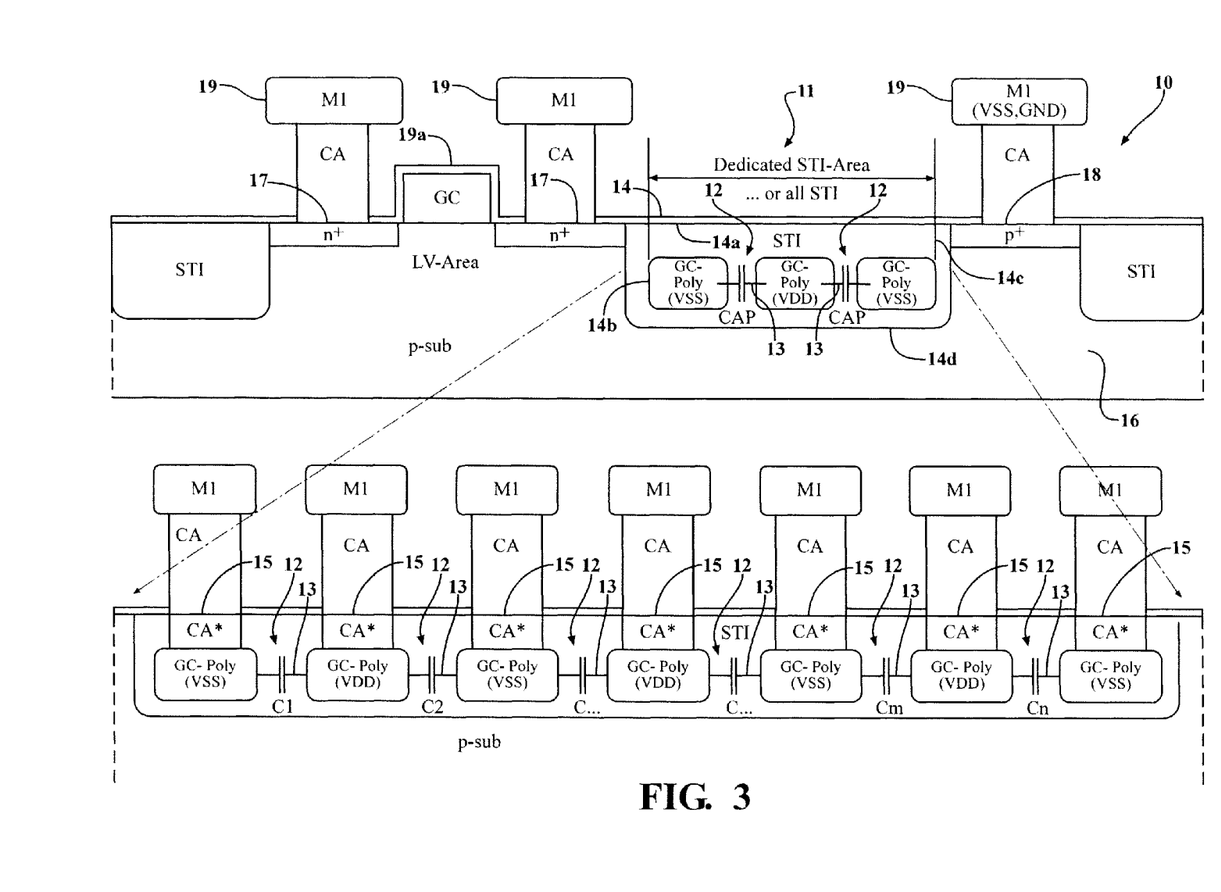
FIG. 3 depicts a cross-sectional view of a semiconductor chip having STI areas with buried buffer capacitors according to a first embodiment of the present invention.

FIG. 3 depicts a cross-sectional view of a semiconductor chip having STI areas with buried buffer capacitors according to a first embodiment. As shown in FIG. 3, a semiconductor chip 10 includes a shallow trench isolation (STI) area 11 having buffer capacitors 12 buried therein, where the buffer capacitors 12 are arranged in a buried line-to-line configuration in which the buffer capacitors 12 are connected via lines in a serial fashion. In this embodiment, the STI area 11 separates the active transistor region 17 and the substrate contact region 18 from each other to prevent electrical current leakage from affecting performance.

The semiconductor chip 10 further includes a metal layer 19 (M1) to transmit electric current. Additionally, the semiconductor chip 10 includes gate electrode stacks (GC) 19a. The gate electrode stacks 19a may be designed by adding a thin layer of gate oxide on top of the silicon surface 14, adding a conducting layer of polysilicon over the gate oxide, and then adding a second conducting layer including a refractory metal (e.g., tungsten) over the polysilicon layer. The use of metal layers and gate electrode stacks is well known in the art and a detailed description thereof is omitted.

The semiconductor chip 10 may be various different types and may be formed from different materials known to those of skill in the art. The semiconductor chip 10 may include different types of active transistor regions, such as various types of Field Effect Transistors (FET) and related technology (including, for example, MOSFET, CMOS, DEPFET, DGMOS-FET, DNAFET, FREDFET, HEMT, IBGT, ISFET, JFET, MESFET, MODFET, NOMFET, and OFET), although other types of transistors, such as Bipolar Junction Transistors (BJT) are also well known in the art and may be used in accordance with aspects of the present invention. The semiconductor chip 10 includes a substrate 16 typically made of silicon. One section of the substrate 16 includes the active transistor region 17, which in this embodiment is a negatively doped (n-type) section, typically formed by adding the chemical elements arsenic, phosphorus, or antimony to silicon. Another section of the substrate 16 includes the active substrate contact region 18, which in this embodiment is a positively doped (p-type) section 18, typically formed by adding the chemical elements boron, gallium, and aluminum to silicon. However, it is understood that the substrate contact region 18 is not limited to being a positively doped (p-type) section 18, and may instead be an n-well section of the substrate 16. Thus, although FIGS. 3-7 illustrate the substrate contact region 18 as the positively doped (p-type) section 18, it is understood that the substrate contact region 18 is not limited to such, and may instead be, for example, a negatively doped n-well section, or other sections of the substrate. The formation and use of semiconductors is well known in the art and a detailed description thereof is omitted.

The STI areas 11 can be formed by utilizing a series of different techniques, such as trench definition and etching, optionally lining the trench with a diffusion barrier, and filling the trench with a trench dielectric material, such as an oxide or a nitride. Furthermore, it is understood that other techniques may also be employed to create the STI areas 11, and such techniques are known to those of skill in the art. According to an aspect of the present invention, each of the STI areas 11 includes an area (trench) formed below the surface 14 of the first semiconductor chip 10, which is distinct from the open area above the STI area 11. However, it is understood that the STI area 11 generally may be referred to as the area both above, below, or a combination of the areas above and below the surface 14 according to other aspects. The STI area 11 may be a dedicated portion of the available STI space in the substrate 16, or may include all of the available STI space in the substrate 16. In FIG. 3, the STI area 11 is defined by a top surface 14a which is adjacent to the surface 14 of the substrate, two sidewalls 14b and 14c substantially perpendicular to the top surface 14a, and a bottom surface 14d. The two sidewalls 14b and 14c define a length from the top surface 14a to the bottom surface 14d. The STI area 11 in FIG. 3 is filled with a dielectric material, such as an oxide or a nitride, and is disposed between the active transistor region 17 and substrate contact region 18. It is understood, however, that the two sidewalls 14b and 14c are not limited to being substantially perpendicular to the top surface 14a, and may instead be formed at various angles to the top surface 14a, may be formed in certain shapes (e.g., a bottle shaped STI area), etc.

The buffer capacitors 12 suppress voltage surges that might damage electrical components in the semiconductor chip 10, as known in the art. The buffer capacitors 12 may be various types, for example, special capacitance cells, capacitance macros, and/or metal-insulator-metal (MIM) CAPs. It is understood, however, that various other types of buffer capacitors 12 may also be used. Furthermore, although the term "buffer capacitor" is used throughout the specification, the "buffer capacitors" used in the embodiments described below may be embodied as any type of capacitor. Thus, use of the term "buffer capacitor" is not intended in any way to limit the scope of the embodiments described below to buffer capacitors.

As shown in the bottom of FIG. 3, which depicts an exploded view of the STI area 11, there are n numbers ($C_1 \ldots C_n$) of first buffer capacitors 12 disposed in the STI area 11, where n is one or more. As shown in the embodiment, the buffer capacitors 12 are arranged in a buried line-to-line configuration (STI BLL CAP) where the buffer capacitors 12 are realized by lines 13 which are parallel, i.e., horizontal, to a surface 14 of the top of the semiconductor chip 10, and the plates of the buffer capacitors 12 are perpendicular, i.e. vertical, to the surface 14. The lines 13 realizing the buffer capacitors 12 are typically formed from poly. The line-to-line capacitance between two neighboring horizontal lines 13 is used to generate the buffer capacitance. For example, the line-to-line capacitance between two neighboring horizontal poly lines 13 is used to generate the buffer capacitance. The parallel lines 13 form the capacitance, where one line 13 corresponds to one of the plates, another line corresponds to another one of the plates, etc. In this embodiment, the buffer capacitors 12 and the lines 13 are completely buried in the STI area 11 such that the buffer capacitors 12 and the lines 13 are beneath a surface 14 of the semiconductor chip 10. It is understood that other types of lines may instead be used to generate the buffer capacitance as well, and it is further understood that the lines are not required to be horizontally disposed, but may instead be disposed at various angles relative to the surface 14. The connection via the contact (CA) and M1 (metal 1) is well known in the art, and a detailed description thereof is omitted.

As a result of burying the buffer capacitors 12 within the STI area 11, the chip space of the semiconductor chip 10 is more efficiently utilized, thereby improving chip performance. That is, instead of having the buffer capacitors 12 located outside of the STI area 11, they are located within the STI area 11, which conserves space and resources. Furthermore, the buffer capacitors 12 may be distributed (equally or otherwise) throughout the semiconductor chip 10, achieving a sufficiently high level of capacitance to protect the electrical components. It is understood, however, that the buffer capacitors 12 are not required to be distributed across the entire semiconductor chip 10 or to be distributed evenly.

Figure 4:
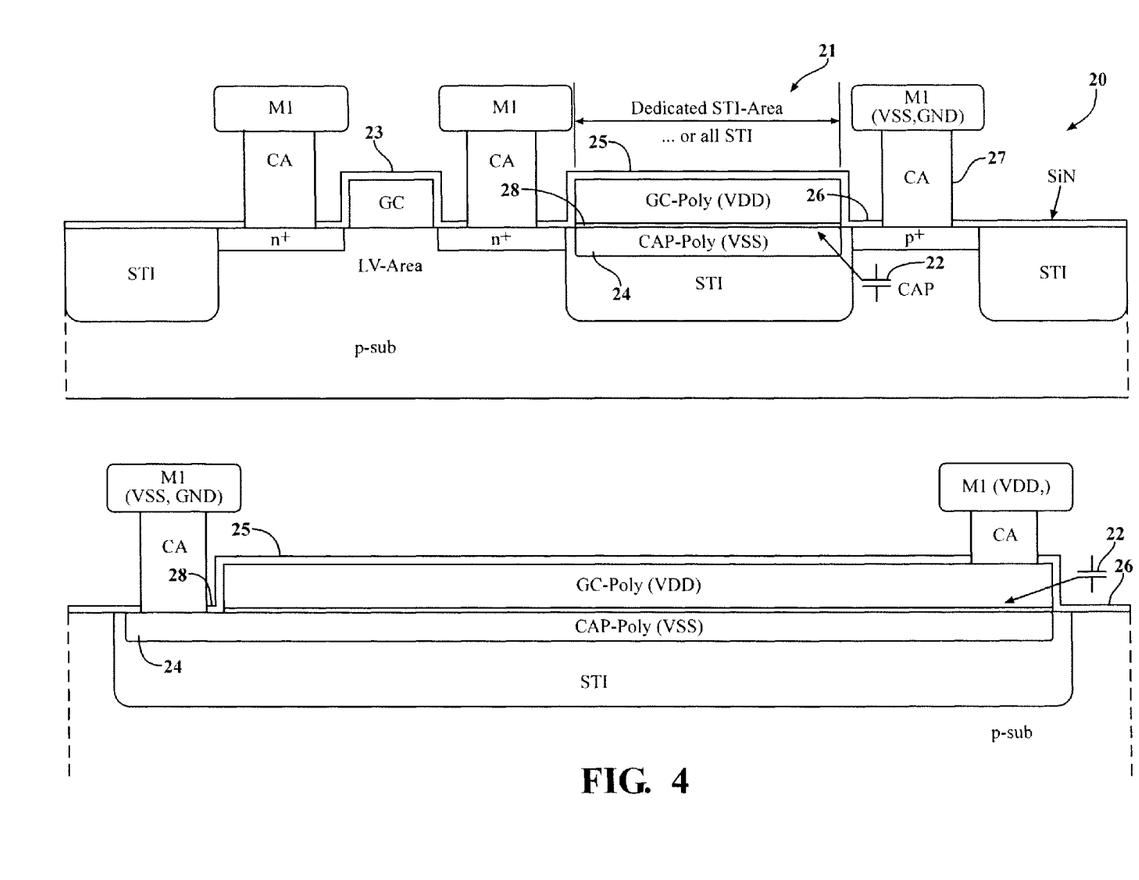
FIG. 4 depicts a cross-sectional view of a semiconductor chip having STI areas with buried buffer capacitors according to a second embodiment of the present invention.

FIG. 4 depicts a cross-sectional view of a semiconductor chip having STI areas with buried buffer capacitors according to a second embodiment. As shown in FIG. 4, a semiconductor chip 20 includes a shallow trench isolation (STI) area 21 having a buffer capacitor 22 partially buried (also referred to as "semi-buried") therein (STI SB CAP). The buffer capacitor 22 has a lower plate 24 and an upper plate 25, separated by an insulator 28. The STI area 21 separates the active transistor region 23 from the substrate contact region 27 to prevent electrical current leakage from affecting performance, similar to the first embodiment.

The semiconductor chip 20 and STI area 21 of the second embodiment may be formed using the same materials and designs as the semiconductor chip 10 and STI area 11 of the first embodiment shown in FIG. 2, or may be formed differently.

As shown in the bottom of FIG. 4, which depicts an exploded view of the STI area 21, the second buffer capacitor 22 uses the classic parallel plate capacitor design of two electrically conducting plates 24 and 25 that are separated from each other by an insulator 28, such as an oxide, and arranged horizontally above each other, with only the lower plate 24 of the buffer capacitor 22 buried in the STI area 21. The upper plate 25 of the buffer capacitor 22 protrudes outside of a surface 26 of the semiconductor chip 20 and is located on the same level as the transistor poly gate of the employed active transistor region 23. The upper and lower plates 24 and 25 of the buffer capacitor 22 are disposed to be substantially parallel to the surface 26, although are not limited to such an embodiment. It is understood that the position of the upper plate 25 and lower plate 24 may be shifted up or down relative to the surface 26.

Figure 5A:
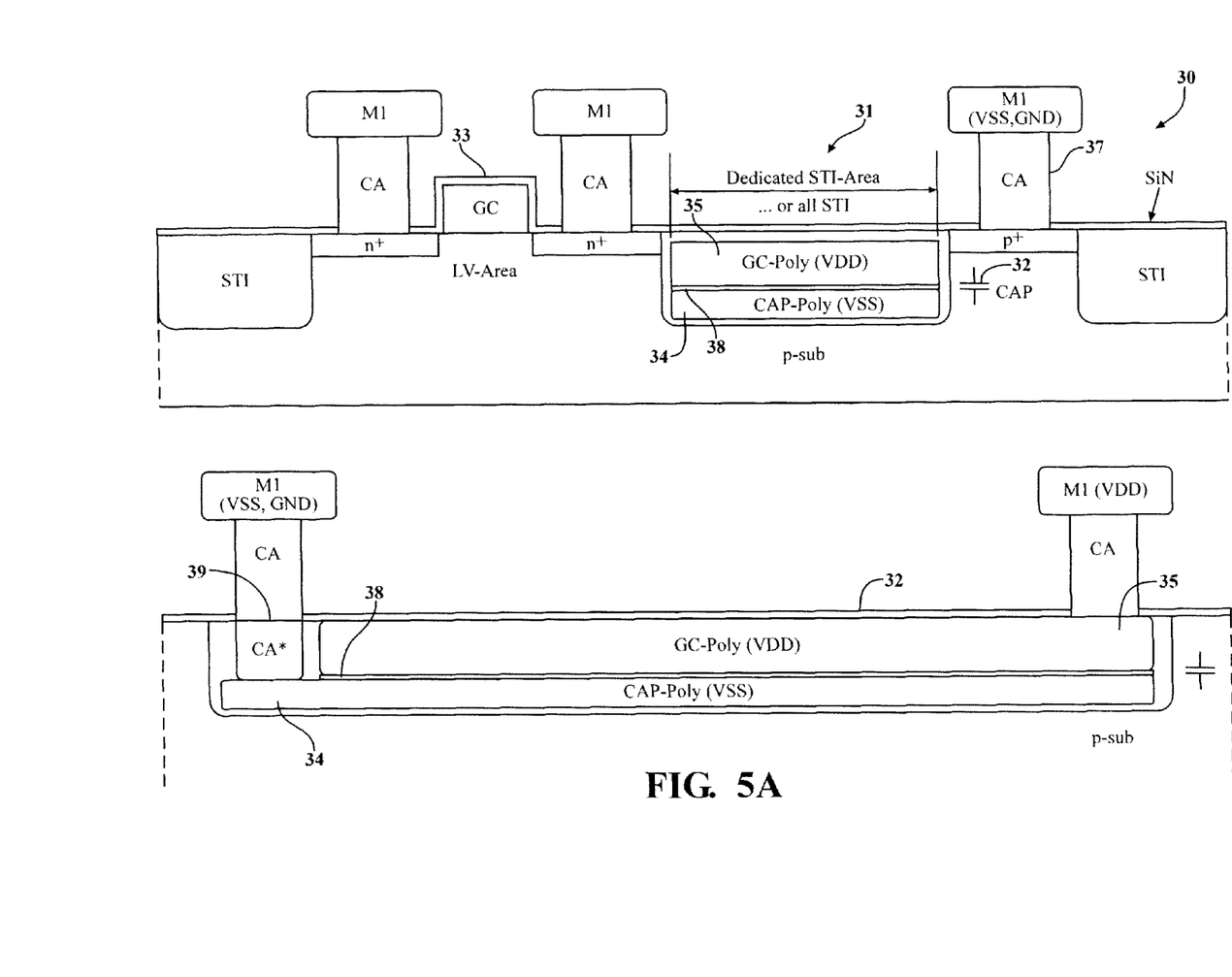
FIG. 5a depicts a cross-sectional view of a semiconductor chip having STI areas with buried buffer capacitors according to a third embodiment of the present invention.

FIG. 5a depicts a cross-sectional view of a semiconductor chip having STI areas with buried buffer capacitors according to a third embodiment. As shown in FIG. 5a, a semiconductor chip 30 includes a shallow trench isolation (STI) area 31 having a buffer capacitor 32 completely buried therein (STI B CAP). The buffer capacitor 32 has a lower plate 34 and an upper plate 35 separated by an insulator 38. The STI area 31 separates the active transistor region 33 and the substrate contact region 37 from each other to prevent electrical current leakage from affecting performance.

As shown in the bottom of FIG. 5a, which depicts an exploded view of the third STI area 31, this third embodiment also uses a classic parallel plate capacitor design of two electrically conducting plates 34 and 35 that are separated from each other by an insulator 38 and arranged horizontally above each other. The plates 34 and 35 are distinguished from conventional architecture since they are completely buried in the STI area 31. Accordingly, the total height of the poly stack of the buffer capacitor 32 is equal to or less than the depth of the STI area 31 within the semiconductor chip 30. In FIG. 5a, the lower (closest to the p-substrate) plate 34 is connected to VSS (GND) or lower than a p-substrate potential via the electrode 39, for the following reason. In a p-type substrate, the substrate itself usually is connected to GND. If, e.g., the lower plate 34 is connected to VDD potential, then the p-substrate might be in inversion because the lower plate 34 over the p-substrate acts as a transistor-gate with the lower gate (lower plate 34) being positive compared to the p-substrate. In order not to invert the p-substrate, it is therefore recommended to connect the lower plate 34 to VSS (GND) (the same potential as the p-substrate) or lower than the p-substrate potential.

Figure 5B:
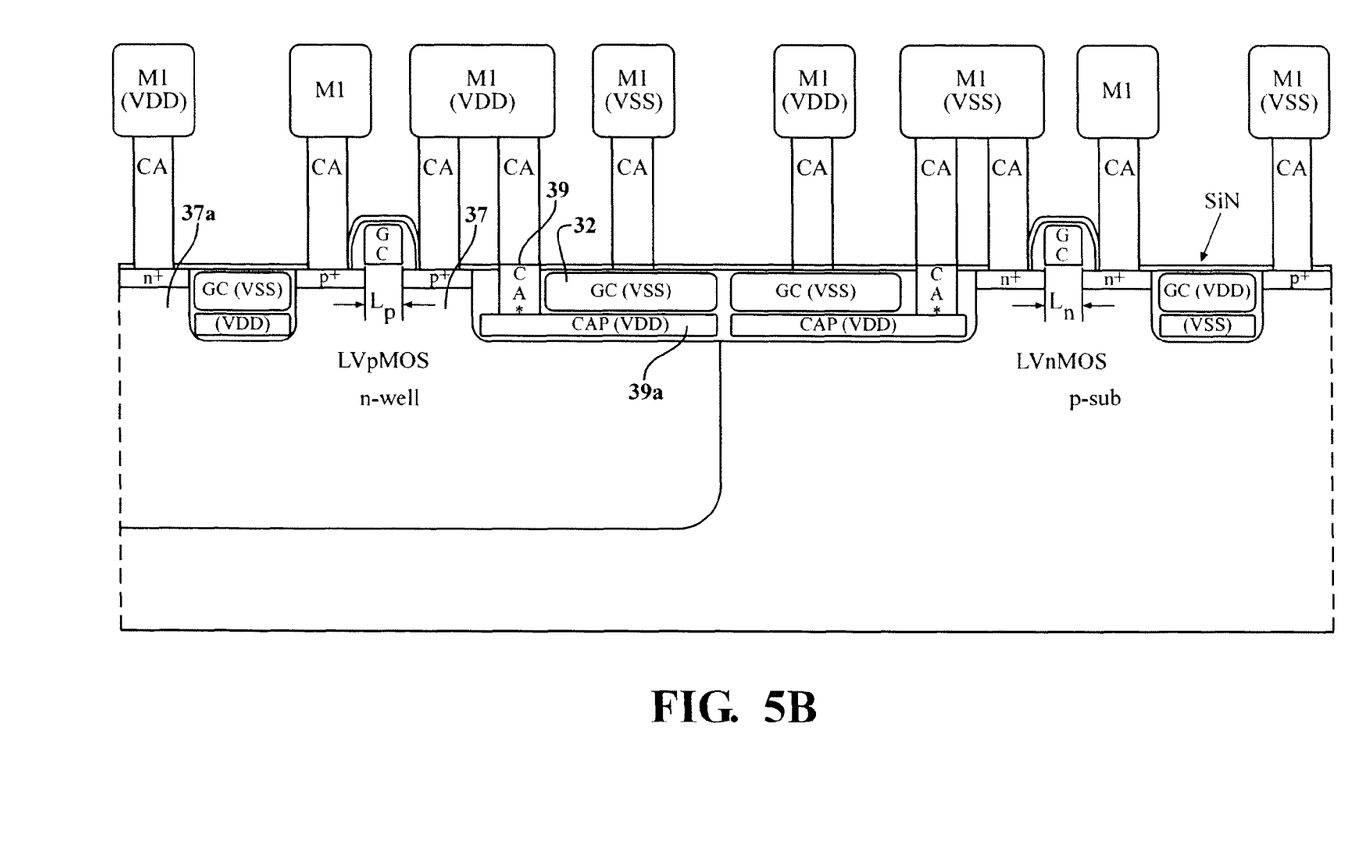
FIG. 5b depicts a variation of the third embodiment where the lower electrode is placed in the n-well.

FIG. 5b depicts a variation of the third embodiment where the lower electrode 39 is placed in the n-well 37a. In FIG. 5b, the lower plate 39a is connected to a positive potential (VDD) or higher than a potential of the n-well via the electrode 39, for the following reason. In this variation, the lower plate 39a of the capacitor is disposed over an n-well. In order to prevent inverting the surface of the n-well, the lower plate 39a preferably is connected to the same potential of the n-well, in this case, VDD potential, or a potential greater than the n-well potential. Furthermore, in general, aspects of the present invention are not limited to connecting the lower plates of the capacitor to the same potential as the underlying potential of the substrate or n-well, but may also include capacitors with one common lower plate disposed over the p-substrate and/or the n-well and having any potential. For example, FIG. 5b illustrates both cases—a lower plate disposed over a p-substrate and connected to VSS (GND), and the lower plate 39a (to the left of the other lower plate) disposed over the n-well and connected to the positive potential VDD via the electrode 39. The connection in both bases is enabled via CA (contact) to M1 (Metal 1).

Figure 6:
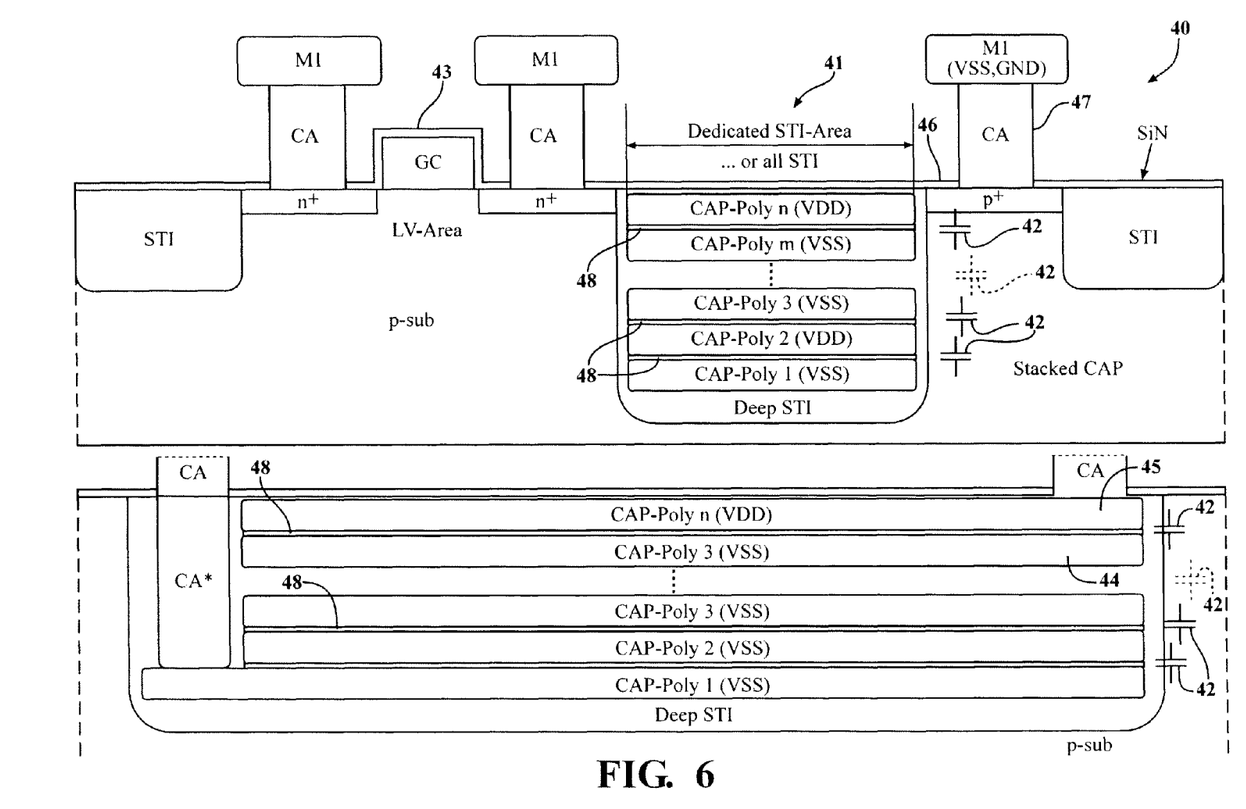
FIG. 6 depicts a cross-sectional view of a semiconductor chip having STI areas with buffer capacitors according to a fourth embodiment of the present invention.

FIG. 6 depicts a cross-sectional view of a semiconductor chip having STI areas with buried buffer capacitors according to a fourth embodiment. As shown in FIG. 6, a semiconductor chip 40 includes a shallow trench isolation (STI) area 41 having multiple buffer capacitors 42 buried therein. Each of the buffer capacitors 42 includes a lower plate 44 and an upper plate 45 separated by an insulator 48. The STI area 41 separates the active transistor region 43 and the substrate contact region 47 from each other to prevent electrical current leakage from affecting performance.

As shown in the bottom of FIG. 6, which depicts an exploded view of the STI area 41, this fourth embodiment is similar to the third embodiment, but employs multiple buried layers of buffer capacitors 42. The STI area 41 includes n numbers of buffer capacitors 42, where n is two or more. The plates of the buffer capacitors 42 are disposed to be substantially parallel to a surface 46 of the semiconductor chip 40. As a result, the depth of the STI area 41 will typically be greater than the depth of the STI area 31 to accommodate the increased height of the entire poly stack (multiple layers) of buffer capacitors 42. Hence, the STI area 41 is a relatively "deep" trench compared to the STI area 31. An advantage of deep STI areas is that deep STI areas provide better isolation from electrical current leakage. As shown in FIG. 6, a top one of the buffer capacitors 48 among the plurality of buffer capacitors 48 is disposed such that the top plate is adjacent to the top surface 46, and the remaining buffer capacitors 48 are stacked below the top buffer capacitor 48 in the STI area 41. The variations regarding the p-substrate and n-well as described in the third embodiment may also apply to this fourth embodiment as well.

Figure 7:
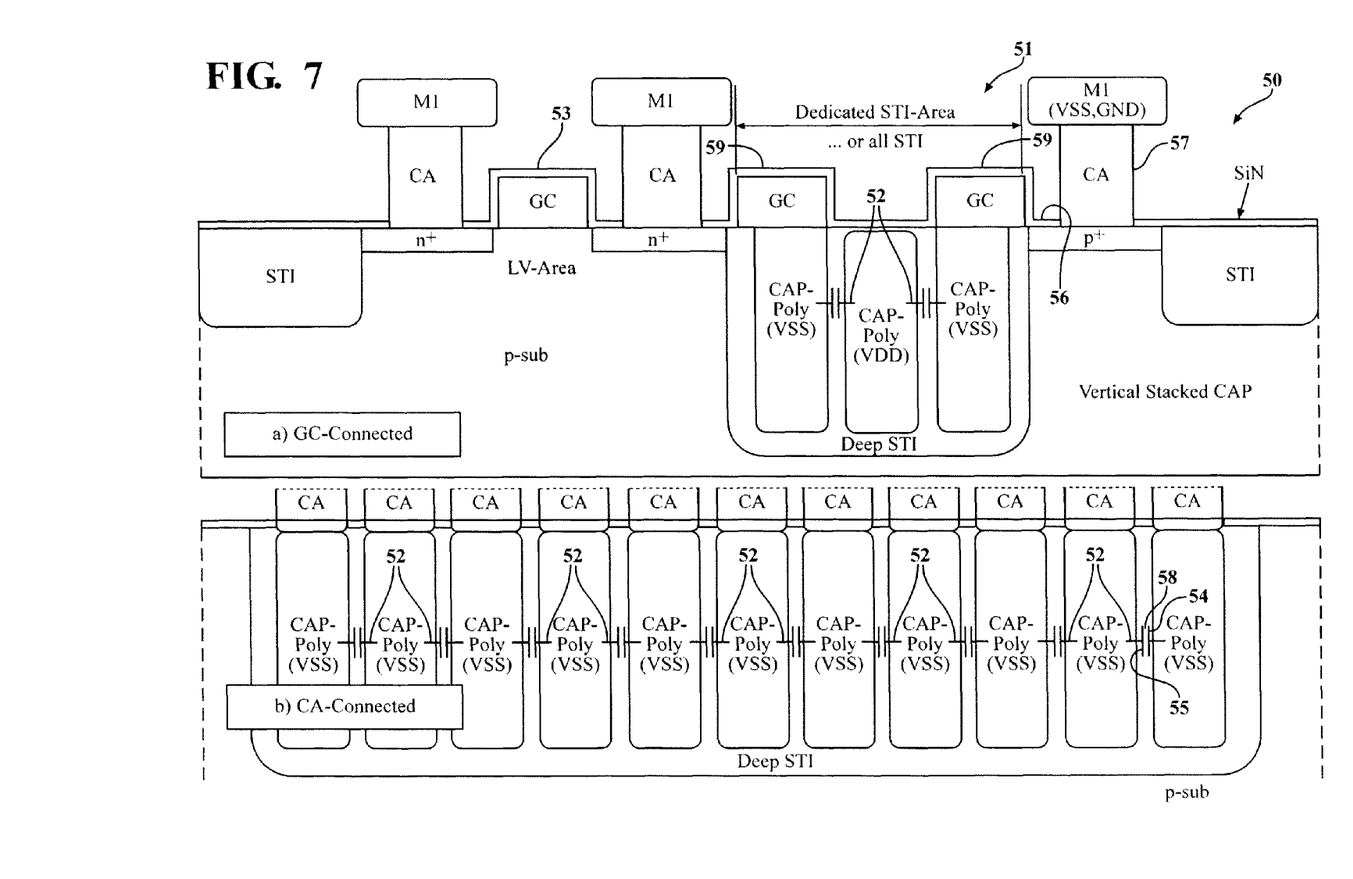
FIG. 7 depicts a cross-sectional view of a semiconductor chip having STI areas with buffer capacitors according to a fifth embodiment of the present invention.

FIG. 7 depicts a cross-sectional view of a semiconductor chip having STI areas with buried buffer capacitors according to a fifth embodiment. As shown in FIG. 7, a semiconductor chip 50 includes a shallow trench isolation (STI) area 51 having buffer capacitors 52 buried therein. Each of the buffer capacitors 52 includes a first plate 54 and a second plate 55 separated by an insulator 58. The STI area 51 separates the active transistor region 53 from the substrate contact region 57 from each other to prevent electrical current leakage from affecting performance.

As shown in the bottom of FIG. 7, which depicts an exploded view of the STI area 51, this fifth embodiment also uses the classic parallel plate capacitor design of two electrically conducting plates 54 and 55 that are separated from each other by an insulator 58. In this fifth embodiment, the conducting plates 54 and 55 of the buffer capacitors 52 are arranged perpendicular, i.e., vertically, to a surface 56. The buffer capacitors 52 are connected to each other in a vertical stacked configuration such that the plates 54 and 55 are stacked in a direction parallel to the top surface 56 and each plate of the buffer capacitors extends downwards from the surface 56 to a bottom portion of the STI area 51. The buffer capacitors 52 are completely buried in the STI area 51. The depth, width, and other dimensions of this STI area 51 may deviate from the specified STI depth if necessary in order to obtain greater or less capacitance of the area, as desired. The vertically arranged capacitor plates of the STI area 51 make contact by a) connecting with the transistor poly gates 59, i.e., the gate electrode stacks (GC), at each end of the stack of buffer capacitors 52, or b) connecting directly through contacts CA. It is noted that this fifth embodiment also employs a "multiple" capacitor approach, where more than one capacitor is buried in the STI area 51, although is not limited to such.

Figure 8:
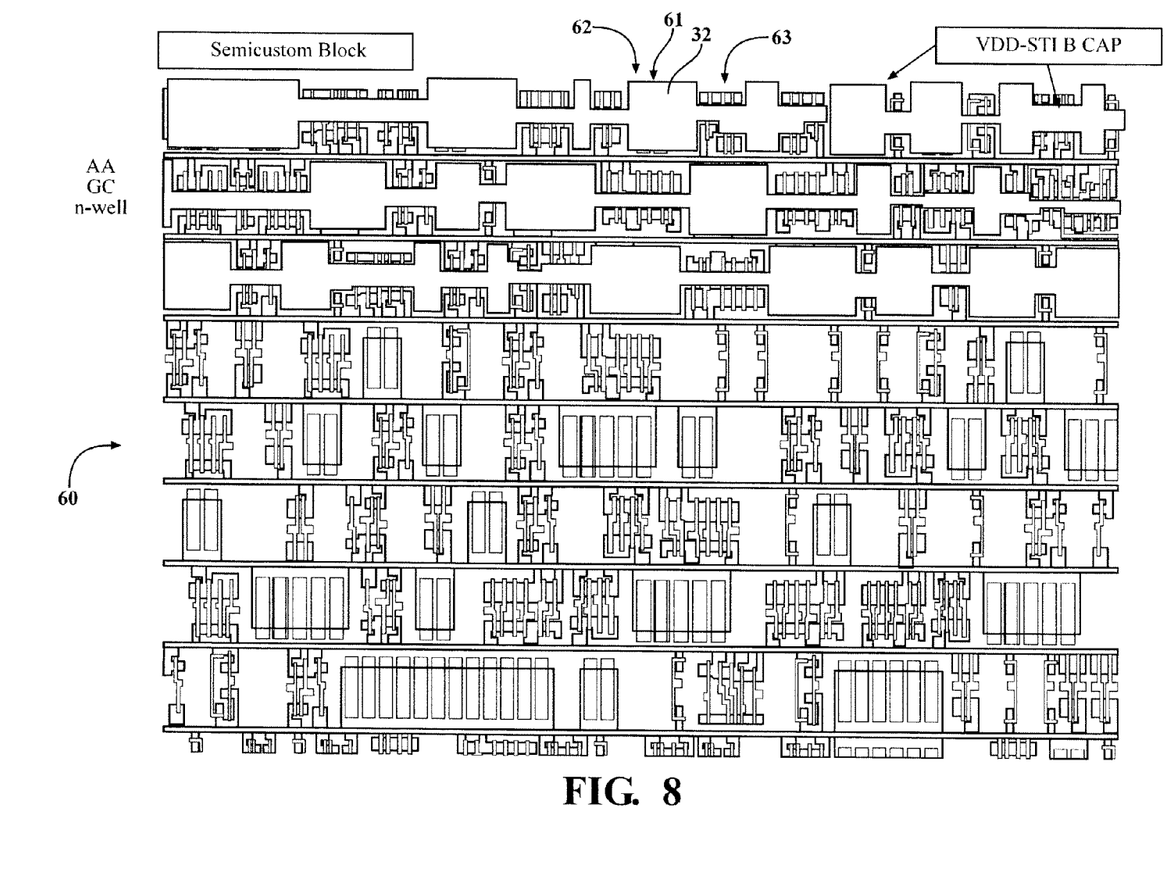
FIG. 8 depicts a semicustom block with the buffer capacitors of FIGS. 5a and 5b completely buried therein, according to an embodiment of the invention.

FIG. 8 depicts a semicustom block 60 with the buffer capacitor 32 of FIGS. 5a and especially 5b completely buried therein, according to an embodiment of the invention. As shown in FIG. 8, the buffer capacitor 32 is distributed throughout a substantial portion of the semicustom block 60, achieving a sufficiently high level of capacitance to protect the electrical components in the block 60. FIG. 8 only illustrates a portion of the semicustom block 60 filled with buffer capacitors, to highlight one aspect of the invention and to show the contrast between sections of the semicustom block 60 with the buffer capacitors in comparison with sections of the semicustom block 60 without the buffer capacitors (FIG. 2). In practice, the semicustom block 60 will preferably, although not necessarily, be completely filled with buffer capacitors. Furthermore, although the buffer capacitor 32 is shown in FIG. 8, it is understood that each of the different buffer capacitors 12, 22, 32, 42, and 52, from the various embodiments, respectively, can be used in the block 60 to achieve the same or similar results. Moreover, combinations of the different embodiments may be employed throughout the block 60. For example, the buffer capacitors 12 (FIG. 3) and 22 (FIG. 4) may be buried in different portions of the STI area 61. Furthermore, the placement of the STI buffer capacitors is not limited to being placed only in semicustom blocks. Instead, the STI buffer capacitors can be placed anywhere and/or everywhere on a chip where an STI area is formed. Thus, the STI buffer capacitors can be distributed throughout the STI all over the chip.

Figure 9:
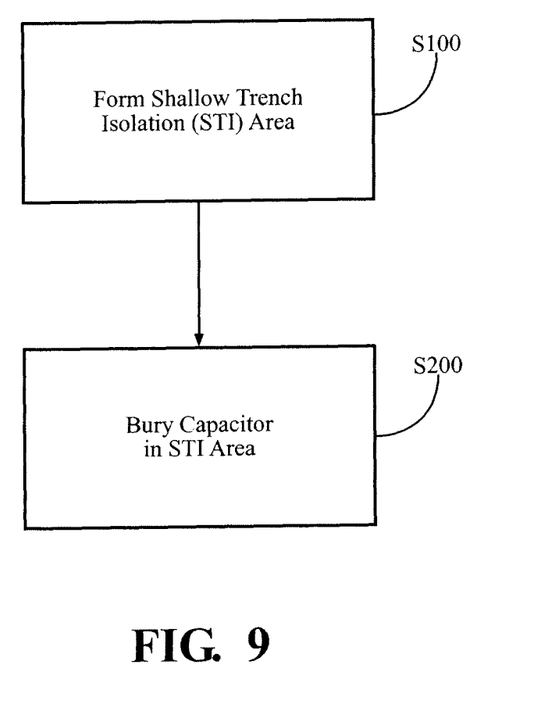
FIG. 9 depicts a method of burying a buffer capacitor into an STI area according to an embodiment of the invention.

FIG. 9 depicts a method of burying a capacitor into an STI area, according to an embodiment of the invention.

In step S100, a Shallow Trench Isolation (STI) area is formed in a semiconductor substrate, such as the semiconductor substrate 16 of FIG. 3. The STI area can be formed by utilizing a series of different techniques, such as trench definition and etching, optionally lining the trench with a diffusion barrier, and filling the trench with a trench dielectric such as an oxide. Various oxides and nitrides are frequently used as the STI dielectric material. Also, a "deep" STI area can alternatively be formed, such as the deep STI areas 41 and 51 shown in FIGS. 6 and 7.

In step S200, at least one capacitor is at least partially buried in the STI area. The capacitor, which may be a buffer capacitor, although is not limited to such, can be buried in the STI areas in any number of ways, including the ways shown and described with respect to the above-described embodiments shown in FIGS. 3-7. For example, buffer capacitors 13 can be buried in the STI area in a line-to-line configuration as shown in FIG. 3. Alternatively, for example, the buffer capacitors 22 can be semi-buried in the STI area as shown in FIG. 4. Moreover, combinations of the different embodiments can be used. It is understood, however, that step S200 is not limited to burying the buffer capacitor according to the five embodiments described above, and may instead be carried out by burying buffer capacitors in any number of other ways. As a result of this method, the space in the semiconductor substrate is more efficiently utilized, thereby improving chip performance. Additionally, since the STI areas are distributed throughout the semiconductor substrate, the method can be used to achieve buffer capacitance throughout the semiconductor substrate, if desired. Moreover, the buffer capacitance can be distributed equally across the semiconductor substrate, if desired.

While the exemplary embodiments are illustrated in the figures and described herein, it should be understood that these embodiments are offered by way of example only. For example, the different embodiments shown in FIGS. 3 through 7 can be combined. Furthermore, the techniques described above can be applied to a very wide range of materials, and are not limited to semiconductor chips, but may instead be applied to any electrically powered device. Accordingly, the described features are not limited to a particular embodiment, but extend to various modifications that nevertheless fall within the scope of the appended claims.

What is claimed is:

1. A semiconductor chip comprising:
   a substrate comprising a surface;
   an active transistor region having a body region and a substrate contact region disposed at the substrate, wherein the substrate contact region is coupled to the body region of the active transistor region, and wherein the substrate contact region forms a substrate contact to the body region of the active transistor region;
   a shallow trench isolation (STI) area disposed at the surface and disposed at least partially between the active transistor region and the substrate contact region;
   at least one capacitor at least partially buried in the isolation material of the STI area; and
   a STI disposed at the surface, wherein the substrate contact region coupled to the body region is disposed between the STI and the STI area comprising the at least one capacitor.

2. The semiconductor chip of claim 1, wherein the at least one capacitor comprises a plurality of capacitors arranged such that the capacitors are completely buried within the STI area, plates of the capacitors are disposed in a direction perpendicular to the surface of the substrate, and the capacitors are connected to each other in a line-to-line configuration.

3. The semiconductor chip of claim 1, wherein the at least one capacitor comprises plates which are substantially parallel to the surface and each other and separated by an insulator, and only one of the plates is buried in the STI area.

4. The semiconductor chip of claim 1, wherein the at least one capacitor comprises plates which are substantially parallel to the surface and each other, separated by an insulator, and completely buried in the STI area.

5. The semiconductor chip of claim 4, wherein the semiconductor chip comprises a p-substrate, and a lower plate of the capacitor plates disposed farthest from the surface is disposed at least partially above the p-substrate and is connected to a ground voltage VSS (GND) or lower than a potential of the p-substrate via an electrode.

6. The semiconductor chip of claim 4, wherein the semiconductor chip comprises an n-well, and a lower plate of the capacitor plates disposed farthest from the surface is disposed at least partially above the n-well and is connected to a positive potential VDD or higher than a potential of the n-well via an electrode.

7. The semiconductor chip of claim 4, wherein the semiconductor chip comprises an n-well and a p-substrate, and a lower plate of the capacitor plates disposed farthest from the surface is disposed at least partially above both the n-well and the p-substrate.

8. The semiconductor chip of claim 1, wherein the at least one capacitor comprises a plurality of capacitors arranged such that each of the capacitors are completely buried within the STI area, plates of each of the capacitors are separated by an insulator and disposed in a direction parallel to the surface of the substrate and each other, and the capacitors are connected to each other in a stacked configuration from a top part of the STI area to a bottom part of the STI area such that the plates of each capacitor are parallel to the surface.

9. The semiconductor chip of claim 1, wherein the at least one capacitor comprises a plurality of capacitors arranged such that the capacitors are completely buried within the STI area, plates of each of the capacitors are separated by an insulator and disposed in a direction perpendicular to the surface of the substrate, and the capacitors are connected to each other in a vertical stacked configuration from one sidewall of the STI area to another sidewall of the STI area such that the plates of each capacitor are perpendicular to the surface.

10. The semiconductor chip of claim 1, wherein the at least one capacitor comprises a pair of plates facing each other and one of the plates is at least partially buried in the STI area.

11. The semiconductor chip of claim 1, wherein a depth of the STI area is sufficient to bury the at least one capacitor.

12. A semiconductor device comprising:
a first shallow trench isolation (STI) disposed between an active transistor region having a body region and a substrate contact region of a semiconductor chip, wherein the substrate contact region is coupled to the body region of the active transistor region, the first STI comprising:
an isolation trench formed into a surface of a substrate of the semiconductor chip, the isolation trench having sidewalls extending into the substrate;
at least one capacitor which is at least partially buried in the isolation material of the first STI between the sidewalls; and
a second STI disposed at the surface, wherein, along a direction perpendicular to the surface of the substrate and extending into the substrate, the second STI is shallower than the first STI, wherein the substrate contact region coupled to the body region is disposed between the second STI and the first STI comprising the at least one capacitor.

13. The device of claim 12, wherein the at least one capacitor comprises a plurality of capacitors arranged such that the capacitors are completely buried within the first STI, plates of the capacitors are disposed in a direction perpendicular to the surface of the substrate, and the capacitors are connected to each other in a line-to-line configuration.

14. The device of claim 12, wherein the at least one capacitor comprises plates which are substantially parallel to the surface and each other and separated by an insulator, and only one of the plates is buried in the first STI.

15. The device of claim 12, wherein the at least one capacitor comprises plates which are substantially parallel to the surface and each other, separated by an insulator, and completely buried in the first STI.

16. The device of claim 12, wherein the at least one capacitor comprises a plurality of capacitors arranged such that each of the capacitors are completely buried within the first STI, plates of each of the capacitors are separated by an insulator and disposed in a direction parallel to the surface of the substrate and each other, and the capacitors are connected to each other in a stacked configuration from a top part of the first STI to a bottom part of the first STI such that the plates of each capacitor are parallel to the surface.

17. The device of claim 12, wherein the at least one capacitor comprises a plurality of capacitors arranged such that the capacitors are completely buried within the first STI, plates of each of the capacitors are separated by an insulator and disposed in a direction perpendicular to the surface of the substrate, and the capacitors are connected to each other in a vertical stacked configuration from one sidewall of the first STI to another sidewall of the first STI such that the plates of each capacitor are perpendicular to the surface.

18. The device of claim 12, further comprising a dielectric material within the first STI.

19. The device of claim 12, wherein the sidewalls are substantially perpendicular to the surface.

20. The semiconductor chip of claim 1, wherein at least one capacitor comprises a plurality of capacitors coupled in series, and wherein the STI area is deeper than the STI.

21. A semiconductor chip comprising:
a well region disposed in a substrate, the well region having a first doping type;
a first transistor disposed in the well region;
a second transistor disposed in a region of the substrate having a second doping type adjacent the well region, the second doping type being opposite to the first doping type, wherein the first transistor is laterally adjacent to the second transistor along a lateral direction oriented along a major surface of the substrate;
a first shallow trench isolation (STI) area comprising an opening disposed between the first transistor and the second transistor; and
a first capacitor and a second capacitor disposed in the opening of the first STI area, the first capacitor having a bottom electrode and a top electrode, the second capacitor having a bottom electrode and a top electrode, wherein the first capacitor is disposed directly over the well region, and wherein the second capacitor is disposed over the region of the substrate having the second doping type and is laterally adjacent the well region along the lateral direction, and wherein, within the opening of the first STI area, along the lateral direction the bottom electrode of the first capacitor is laterally adjacent to the bottom electrode of the second capacitor, wherein the bottom electrode of the first capacitor is separated from the bottom electrode of the second capacitor by the isolating material of the first STI area.

22. The semiconductor chip of claim 21, wherein the bottom electrode of the first capacitor and the bottom electrode of the second capacitor are formed in the same level.

23. The semiconductor chip of claim 21, wherein the bottom electrode of the first capacitor is coupled to a source/drain region of the first transistor.

24. The semiconductor chip of claim 23, wherein the bottom electrode of the second capacitor is coupled to a source/drain region of the second transistor.

25. The semiconductor chip of claim 21, wherein the bottom electrode of the first capacitor is coupled to a different potential than the bottom electrode of the second capacitor.

26. The semiconductor chip of claim 21, wherein the bottom electrode of the first capacitor is coupled to the same potential as the top electrode of the second capacitor.

27. The semiconductor chip of claim 21, further comprising:
   a second STI area disposed in the well region;
   a third capacitor disposed within the second STI area;
   a third STI area disposed in the region of the substrate having the second doping type; and
   a fourth capacitor disposed within the third STI area, wherein the first transistor comprises a first source/drain region, a second source/drain region, and a substrate contact region, wherein the second transistor comprises a first source/drain region, a second source/drain region, and the substrate contact region.

28. The semiconductor chip of claim 27, wherein the second source/drain region of the first transistor and the bottom electrode of the first capacitor are coupled to a first potential node, wherein the second STI area is disposed between the substrate contact region of the first transistor and the first source/drain region of the first transistor.

29. The semiconductor chip of claim 28, wherein the first source/drain region of the second transistor and the bottom electrode of the second capacitor are coupled to a second potential node different from the first potential node, wherein third STI area is disposed between the substrate contact region of the second transistor and the second source/drain region of the second transistor.

* * * * *